(12) United States Patent
Park et al.

(10) Patent No.: US 11,367,487 B2
(45) Date of Patent: Jun. 21, 2022

(54) NONVOLATILE MEMORY DEVICE AND ERASE METHOD THEREOF

(71) Applicant: SAMSUNG ELECTRONICS CO., LTD., Suwon-si (KR)

(72) Inventors: Sang-Won Park, Suwon-si (KR); Won Bo Shim, Suwon-si (KR); Bong Soon Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 16/693,925

(22) Filed: Nov. 25, 2019

(65) Prior Publication Data
US 2020/0303011 A1 Sep. 24, 2020

(30) Foreign Application Priority Data
Mar. 21, 2019 (KR) .......................... 10-2019-0032270

(51) Int. Cl.
| | | |
|---|---|---|
| *G11C 16/16* | (2006.01) | |
| *G11C 16/24* | (2006.01) | |
| *G11C 16/34* | (2006.01) | |
| *G11C 16/12* | (2006.01) | |

(52) U.S. Cl.
CPC .............. *G11C 16/16* (2013.01); *G11C 16/12* (2013.01); *G11C 16/24* (2013.01); *G11C 16/3445* (2013.01)

(58) Field of Classification Search
CPC ...... G11C 16/0483; G11C 16/08; G11C 16/10; G11C 16/107; G11C 16/12; G11C 16/16; G11C 16/24; G11C 16/3445
See application file for complete search history.

(56) References Cited

U.S. PATENT DOCUMENTS

| | | |
|---|---|---|
| 5,978,276 A | 11/1999 | Wong |
| 8,391,078 B2 | 3/2013 | Leung |
| 8,446,780 B2 | 5/2013 | Iwai |
| 8,488,378 B2 | 7/2013 | Maeda |
| 8,514,627 B2 | 8/2013 | Itagaki et al. |
| 8,537,615 B2 | 9/2013 | Maeda |
| 8,649,227 B2 | 2/2014 | Maeda |
| 8,743,624 B2 | 6/2014 | Lutze et al. |
| 8,872,249 B2 | 10/2014 | Jung |
| 8,902,658 B1 | 12/2014 | Raghu et al. |
| 8,929,141 B1 | 1/2015 | Raghu et al. |
| 9,006,089 B2 | 4/2015 | Jung |
| 9,236,139 B1 | 1/2016 | Lai et al. |
| 9,349,464 B2 | 5/2016 | Shiga et al. |
| 9,355,731 B2 | 5/2016 | Shiga et al. |
| 9,437,307 B2 | 9/2016 | Itagaki et al. |

(Continued)

*Primary Examiner* — Douglas King
(74) *Attorney, Agent, or Firm* — Lee IP Law, PC

(57) ABSTRACT

A non-volatile memory device includes a memory cell array including a plurality of cell strings, each of the plurality of cell strings includes a gate-induced drain leakage (GIDL) transistor and a memory cell group, and a control logic to apply a voltage to each of the plurality of cell strings. The control logic performs a first erase operation of erasing the memory cell groups of each of the plurality of cell strings, a first verification operation of detecting erase results of the memory cell groups of each of the plurality of cell strings, and a program operation of programming the GIDL transistors of some of the plurality of cell strings.

18 Claims, 15 Drawing Sheets

(56) References Cited

U.S. PATENT DOCUMENTS

| | | | |
|---|---|---|---|
| 9,543,023 B2 | 1/2017 | Lai et al. | |
| 9,685,235 B2 | 6/2017 | Park et al. | |
| 9,691,785 B2 | 6/2017 | Lee et al. | |
| 10,074,440 B2 | 9/2018 | Ray et al. | |
| 2009/0262576 A1* | 10/2009 | Moon | G11C 16/0483 365/185.2 |
| 2012/0069660 A1 | 3/2012 | Iwai et al. | |
| 2014/0313829 A1 | 10/2014 | Iwai et al. | |

* cited by examiner

FIG. 9a

| | | Loop1 | | |
|---|---|---|---|---|
| | | Erase | Verify | GT Program |
| NS11 | GT | V_GT1 | V_GT1 | V_GT1' |
| | MC | V_verify / V_MC1 | V_verify / V_MC1 | V_verify / V_MC1 |
| NS12 | GT | V_GT2 | V_GT2 | V_GT2 |
| | MC | V_MC2 / V_verify | V_MC2 / V_verify | V_MC2 / V_verify |

FIG. 9b

| | | Loop2 | | |
|---|---|---|---|---|
| | | Erase | Verify | GT Recovery |
| NS11 | GT | V_GT1' | V_GT1' | V_GT1 |
| | MC | V_MC1' / V_verify | V_MC1' / V_verify | V_MC1' / V_verify |
| NS12 | GT | V_GT2 | V_GT2 | V_GT2 |
| | MC | V_MC2 / V_verify | V_MC2 / V_verify | V_MC2 / V_verify |

NONVOLATILE MEMORY DEVICE AND ERASE METHOD THEREOF

CROSS-REFERENCE TO RELATED APPLICATION

Korean Patent Application No. 10-2019-0032270, filed on Mar. 21, 2019, in the Korean Intellectual Property Office, and entitled: "Nonvolatile Memory Device and Erase Method Thereof," is incorporated by reference herein in its entirety.

BACKGROUND

1. Field

Embodiments relate to a non-volatile memory device and an erase method of the non-volatile memory device. More particularly, embodiments relate to a non-volatile memory device that reduces or suppresses an occurrence of deep erase cell and a method of operating the same.

2. Description of the Related Art

A semiconductor memory device may be broadly divided into a volatile semiconductor memory device and a non-volatile semiconductor memory device. The non-volatile memory device may include a ROM (Read Only Memory), a PROM (Programmable ROM), an EPROM (Electrically Programmable ROM), an EEPROM (Electrically Erasable and Programmable ROM), a flash memory, a PRAM (Phase-change RAM), a MRAM (Magnetic RAM), a RRAM (Resistive RAM), a FRAM (Ferroelectric RAM), and the like. Recently, as the demand for high integration of memory devices increases, multi-bit flash memory devices that store multi-bits in one memory cell are universalized.

SUMMARY

According to some embodiments, a non-volatile memory device includes a memory cell array including a plurality of cell strings, each of the plurality of cell strings includes a gate-induced drain leakage (GIDL) transistor and a memory cell group, and a control logic configured to apply a voltage to each of the plurality of cell strings. The control logic performs a first erase operation of erasing the memory cell groups of each of the plurality of cell strings, a first verification operation of detecting erase results of the memory cell groups of each of the plurality of cell strings, and a program operation of programming the GIDL transistors of some of the plurality of cell strings.

According to some embodiments, a non-volatile memory device includes a first cell string connected to a first bit line and including a first memory cell group and a first a gate-induced drain leakage (GIDL) transistor, and a control logic configured to apply a voltage to the first bit line. The control logic performs a program operation of programming the first GIDL transistor, and an erase operation of erasing the first memory cell group, using the programmed first GIDL transistor.

According to some embodiments, a non-volatile memory device includes a first cell string connected to a first bit line and including a first memory cell group and a first a gate-induced drain leakage (GIDL) transistor, a second cell string connected to a second bit line and including a second memory cell group and a second GIDL transistor, and a control logic configured to apply a voltage to the first and second bit lines. The control logic programs the first and second GIDL transistors at a first level, the control logic programs the first GIDL transistor at a second level greater than the first level, and the control logic erases the first and second memory cell groups, using the first and second GIDL transistors.

BRIEF DESCRIPTION OF THE DRAWINGS

Features will become apparent to those of skill in the art by describing in detail exemplary embodiments with reference to the attached drawings in which:

FIG. 8b illustrates an enlarged view of a region A of FIG. 8a.

FIGS. 9a and 9b are diagrams illustrating threshold voltage illustrating the erase work of the memory device of FIG. 2.

DETAILED DESCRIPTION

Figure 1:
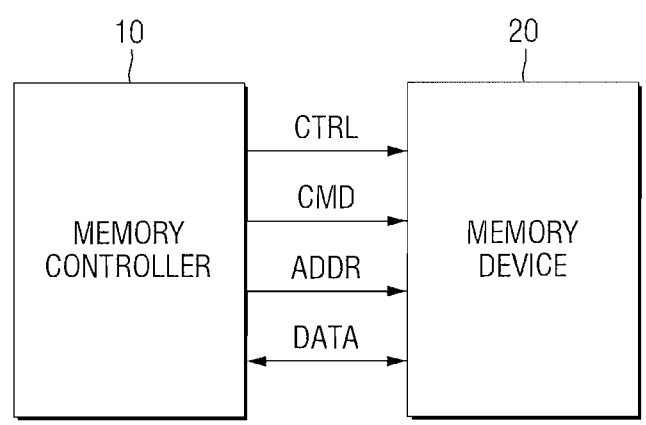
FIG. 1 illustrates a memory system according to some embodiments.

FIG. 1 illustrates a memory system according to some embodiments. Referring to FIG. 1, the memory system may include a memory controller 10 and a non-volatile memory device 20.

The memory controller 10 may control the operation of the non-volatile memory device 20. Specifically, the memory controller 10 may provide a command CMD, an address ADDR and a control signal CTRL along input/output lines connected to the non-volatile memory device 20. Also, the memory controller 10 may provide or receive data DATA along the input/output lines connected with the non-volatile memory device 20.

The command CMD provided by the memory controller 10 to the non-volatile memory device 100 may include read, write, erase, and the like.

The non-volatile memory device 20 may store data or provide stored data on the basis of the address ADDR, command CMD, and control signal CTRL provided from the memory controller 10.

The non-volatile memory device 20 may include, for example, a NAND flash memory, a vertical NAND flash memory (VNAND), a NOR flash memory, a resistor RAM (RRAM), a phase change memory (RRAM), a magnetoresistive memory (MRAM), a ferroelectric memory (FRAM), a spin injection magnetization reversal memory (Spin STT-RAM) and the like. Hereinafter, embodiments will be described by taking an example in which the non-volatile memory device 20 is a vertical NAND flash memory (VNAND), but may be applied to other types of memories.

Figure 2:
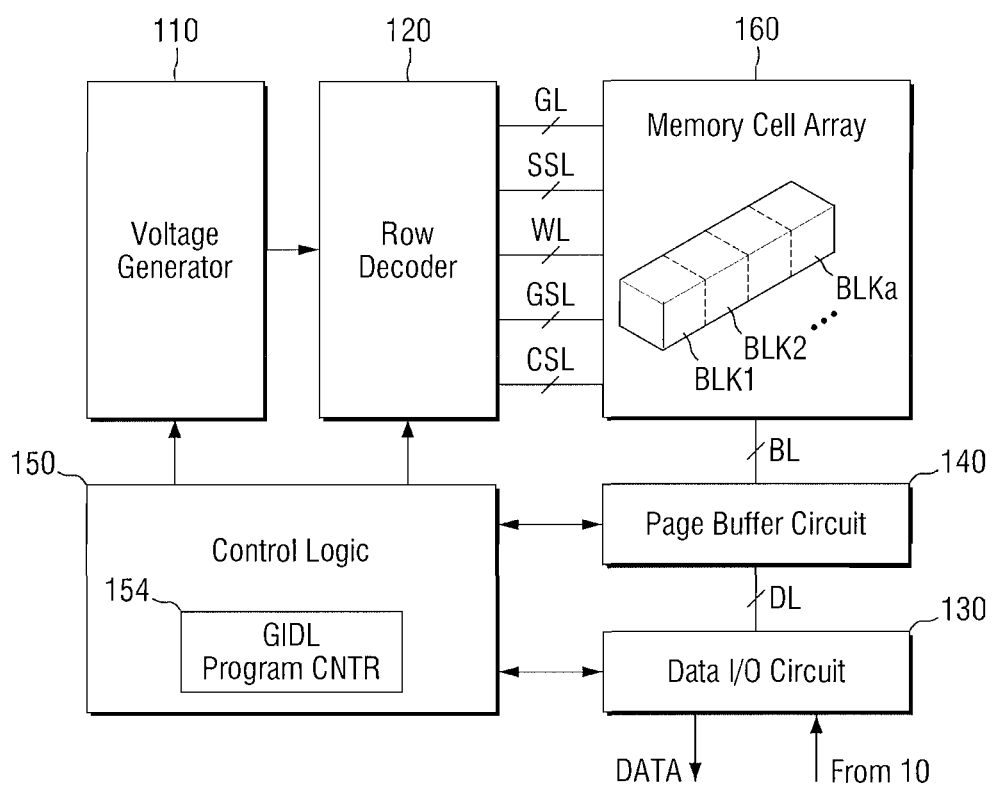
FIG. 2 illustrates a memory device of the memory system of FIG. 1.

FIG. 2 illustrates a memory device of the memory system of FIG. 1. Referring to FIGS. 1 and 2, the non-volatile memory device 20 may include a voltage generator 110, a row decoder 120, a data input/output circuit 130, a page buffer circuit 140, a control logic 150, and a memory cell array 160.

The voltage generator 110 may generate the operating voltage necessary for the operation of the non-volatile memory device 20, using the power supply voltage. The operating voltage may include, e.g., a program voltage, an inhibit voltage, a read voltage, a read pass voltage, a bit line voltage, a common source line voltage, and the like, and various combinations thereof.

The row decoder 120 may be connected to a memory cell array 160 via a gate-induced drain leakage (GIDL) line GL, a string selection line SSL, a word line WL, a ground selection line GSL, and a common source line CSL. The row decoder 120 may receive the operating signal from the control logic 150. The row decoder 120 may operate in response to the operating signal received from the control logic.

The data input/output circuit 130 may be connected to the control logic 150. The data input/output circuit 130 may perform operations, e.g., input and output, on the basis of the operating signal from the control logic 150. The data input/output circuit 130 may provide an address ADDR, a command CMD, a control signal CTRL, and the like received from the memory controller 10 to the control logic 150.

The data input/output circuit 130 may provide input data to the page buffer circuit 140 through the data line DL. The data input/output circuit 130 may output the data DATA received from the page buffer circuit 140 to the outside.

The page buffer circuit 140 may receive an operating signal from the control logic 150. The page buffer circuit 140 may perform operations, e.g., such as erase, verification, program, and so forth, in accordance with the operating signal from the control logic 150.

The page buffer circuit 140 may be connected to the memory cell array 160 via a bit line BL. The page buffer circuit 140 may provide the same voltage to each bit line BL through the bit line BL at the time of an erase operation. The page buffer circuit 140 may apply a read voltage to the bit line BL at the time of the verification operation to detect an erase result of the memory cell. The page buffer circuit 140 may apply a program voltage or an inhibit voltage to the bit line BL at the time of the program operation to program memory cells connected to the bit line BL to which the program voltage is applied.

The control logic 150 may generate operating signals, e.g., erase, verification, and program, on the basis of a command CMD or a control signal CTRL from the memory controller 10. The control logic 150 may provide the generated operating signal to the voltage generator 110, the row decoder 120, the page buffer circuit 140, or the data input/output circuit 130.

Figure 3:
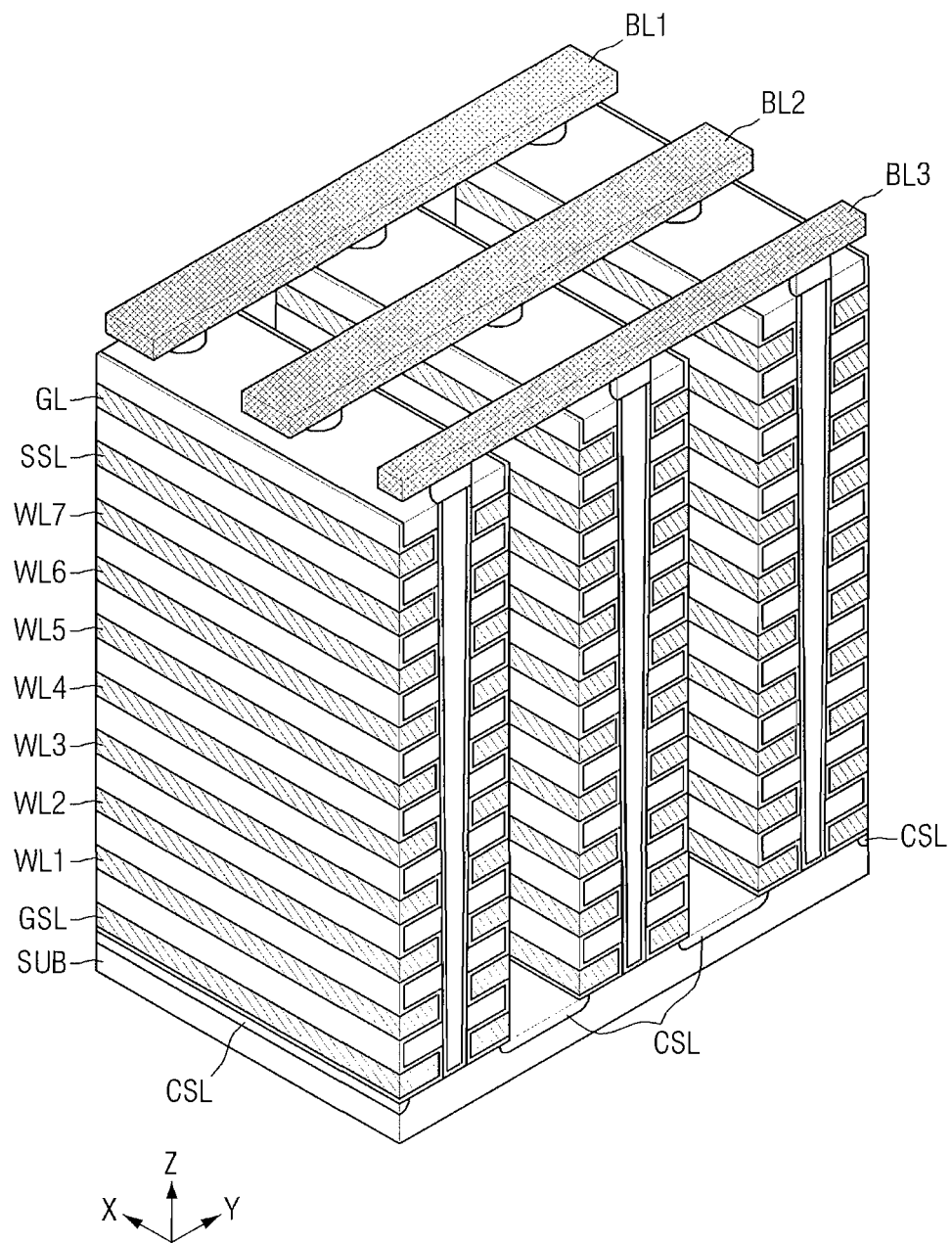
FIG. 3 illustrates a perspective view of a memory block of the memory cell array of FIG. 2.
Figure 4:
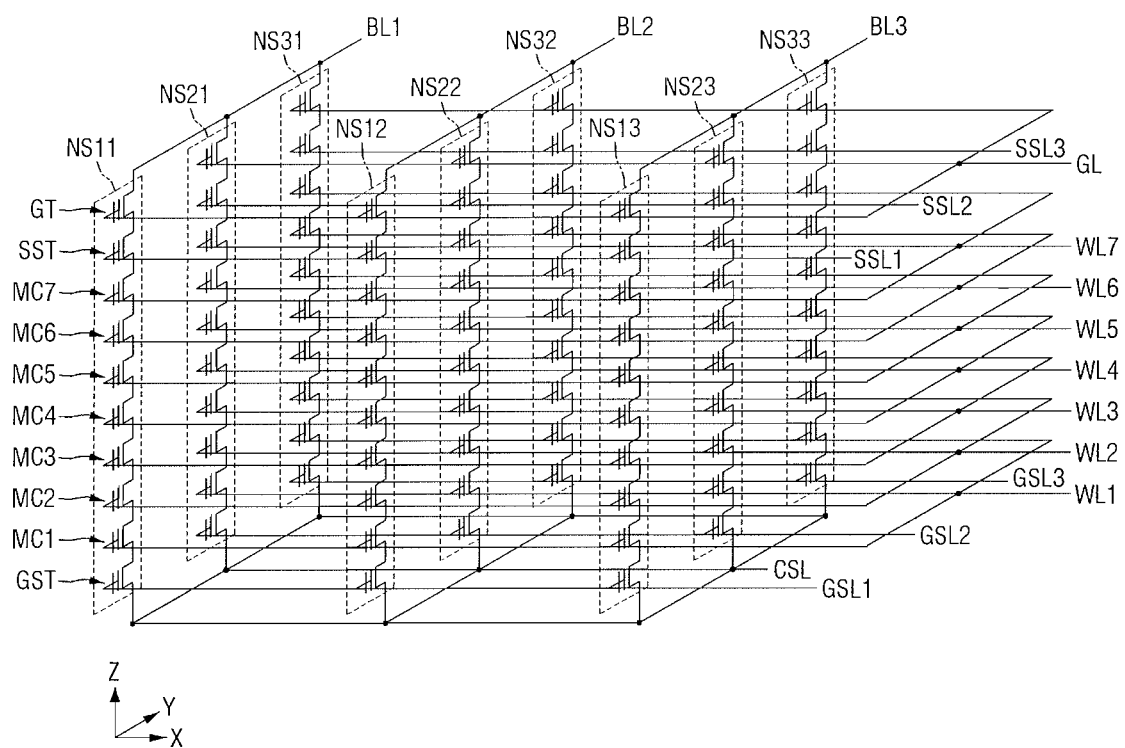
FIG. 4 illustrates a circuit diagram of the memory block of FIG. 3.

The memory cell array 160 will be described below with reference to FIGS. 2 to 4. FIG. 3 illustrates a perspective view of a memory block of the memory cell array of FIG. 2. FIG. 4 illustrates a circuit diagram of the memory block of FIG. 3.

Referring to FIG. 2, the memory cell array 160 may be connected to the row decoder 120 through the GIDL line GL, the string selection line SSL, the word line WL, the ground selection line GSL, and common source line CSL. The memory cell array 160 may be connected to the page buffer circuit 140 through the bit line BL.

The memory cell array 160 may include a plurality of memory blocks BLK1 to BLKa. Each of the plurality of memory blocks BLK1 to BLKa may be connected to the row decoder 120 through the GIDL line GL, a plurality of word lines WL, at least one string selection line SSL, at least one ground selection line GSL, and a common source line CSL. In addition, each of the plurality of memory blocks BLK1 to BLKa may be connected to the page buffer circuit 140 through a plurality of bit lines BL.

Referring to FIG. 3, each of the plurality of memory blocks BLK1 to BLKa may include a substrate SUB, a ground selection line GSL, a plurality of word lines WL1 to WL7, a string selection line SSL, a GIDL line GL and a plurality of bit lines BL.

The ground selection line GSL, the plurality of word lines WL1 to WL7, the string selection line SSL, and the GIDL line GL may extend in the first direction X on the substrate SUB. Also, the plurality of bit lines BL may extend in a second direction Y on the substrate SUB.

The ground selection line GSL, the plurality of word lines WL1 to WL7, the string selection line SSL, the GIDL line GL, and the plurality of bit lines BL may be stacked sequentially on the substrate SUB in a third direction Z.

Referring to FIG. 4, the memory block includes a plurality of cell strings NS11 to NS33 arranged along the first direction X and the second direction Y. Each of the plurality of cell strings NS11 to NS33 may include a GIDL transistor GT, a string selection transistor SST, a plurality of memory cells MC1 to MC7, and a ground selection transistor GST. The GIDL transistor GT, the string selection transistor SST, the plurality of memory cells MC1 to MC7, and the ground selection transistor GST may be connected in series along the third direction.

In FIG. 4, the number of cell strings, the number of bit lines, the number of string selection lines, and the number of ground selection lines included in the memory block are illustrated as being 9, 3, 3, and 3, respectively. However, this is only for the convenience of description.

Each of the plurality of cell strings NS11 to NS33 may be connected to one of the plurality of bit lines BL1 to BL3 extending in the second direction Y. For example, the first, fourth, and seventh cell strings NS11, NS21, and NS31 may be connected to the first bit line BL1. The second, fifth, and eighth cell strings NS12, NS22, and NS32 may be connected to the second bit line BL2. The third, sixth, and ninth cell strings NS13, NS23 and NS33 may be connected to the third bit line BL3.

In some embodiments, each of the plurality of bit lines BL1 to BL3 may be connected to the GIDL transistors GT of each of a plurality of cell strings NS11 to NS33. In FIG. 4, each of the plurality of bit lines BL is illustrated as being connected to the GIDL transistor GT. In an implementation, the GIDL transistor GT may be below the ground selection transistor GST. At this time, each of the plurality of bit lines BL may be connected to the string selection transistor SST.

Referring to FIGS. 2 and 4 again, the page buffer circuit 140 may apply a voltage to each of the plurality of bit lines BL. For example, in the program operation, the page buffer circuit 140 may apply a program voltage to the first bit line BL1 and may apply an inhibit voltage to the second and third bit lines BL2 and BL3.

The GIDL transistor GT of each of the plurality of cell strings NS11 to NS33 may be connected to the GIDL line. In FIG. 4, the GIDL transistors GT of each of the plurality of cell strings NS11 to NS33 are illustrated as being connected to one GIDL line GL.

The GIDL transistor GT may be used for an erase operation for erasing at least some of the plurality of memory cells MC1 to MC7. For example, the GIDL transistor GT may generate a voltage for erasing at least some of the plurality of memory cells MC1 to MC7 on the basis of a difference in voltages applied to the bit line BL and the GIDL line GL.

The string selection transistors SST of each of the plurality of cell strings NS11 to NS33 may be connected to one of the plurality of string selection lines SSL1 to SSL3 extending in the first direction X. For example, the string selection transistors SST of the first, second, and third cell strings NS11, NS12 and NS13 may be connected to the first string selection line SSL1. The string selection transistors SST of the fourth, fifth, and sixth cell strings NS21, NS22, and NS23 and the string selection transistors SST of the seventh, eighth and ninth cell strings NS31, NS32, and NS33 may be connected to the second string selection line SSL2 and the third string selection line SSL3, respectively.

Referring to FIGS. 2 and 4 again, the row decoder 120 may select some of a plurality of strings selection lines SSL1 to SSL3. For example, the row decoder 120 may apply a selection voltage to the first string selection line SSL1, and may apply a non-selection voltage to the second and third string selection lines SSL.

At this time, the string selection transistors SST of the first, second, and third cell strings NS11, NS12, and NS13 connected to the first string selection line SSL1 may be activated. On the other hand, the string selection transistors SST of the fourth to ninth cell strings NS21 not NS33 connected to the second and third string selection lines SSL may not be activated.

A plurality of cell strings NS11 to NS33 may be arranged in a plurality of rows and a plurality of columns by being connected to a plurality of bit lines BL and a plurality of string selection lines SSL. For example, the first, fourth and seventh cell strings NS11, NS21 and NS31 connected to the first bit line BL1 may be disposed in a single column along the second direction Y. The first, second and third cell strings NS11, NS12 and NS13 connected to the first string selection line SSL1 may be arranged in a single row along the first direction X.

A plurality of memory cells MC1 to MC7 of each of the plurality of cell strings NS11 to NS33 may be connected to a plurality of word lines WL, respectively. For example, the first memory cells MC1 of the plurality of cell strings NS11 to NS33 may be connected to a single first word line WL1. Similarly, the second to seventh memory cells MC2 to MC7 of the memory block may be connected to the second to seventh word lines WL2 to WL7, respectively. Each of the plurality of memory cells MC1 to MC7 may be used to store data. In some embodiments, each of the plurality of memory cells MC1 to MC7 may be used to store multi-bit data.

The ground selection transistors GST of each of the plurality of cell strings NS11 to NS33 may be connected to the common source line (CSL). Also, the ground selection transistors GST of the plurality of cell strings NS11 to NS33 may be connected to one of the plurality of ground selection line GSL1 to GSL3 extending in the first direction. For example, the ground selection transistors GST of the first, second and third cell strings NS11, NS12 and NS13 may be connected to the first ground selection line GSL.

Referring to FIGS. 2 and 4 again, the row decoder 120 may select some of the plurality of ground select lines GSL1 to GSL3. For example, the row decoder 120 may apply a selection voltage to the first ground selection line GSL and apply a non-selection voltage to the second and third ground selection lines GSL2 and GSL3.

Figure 5:
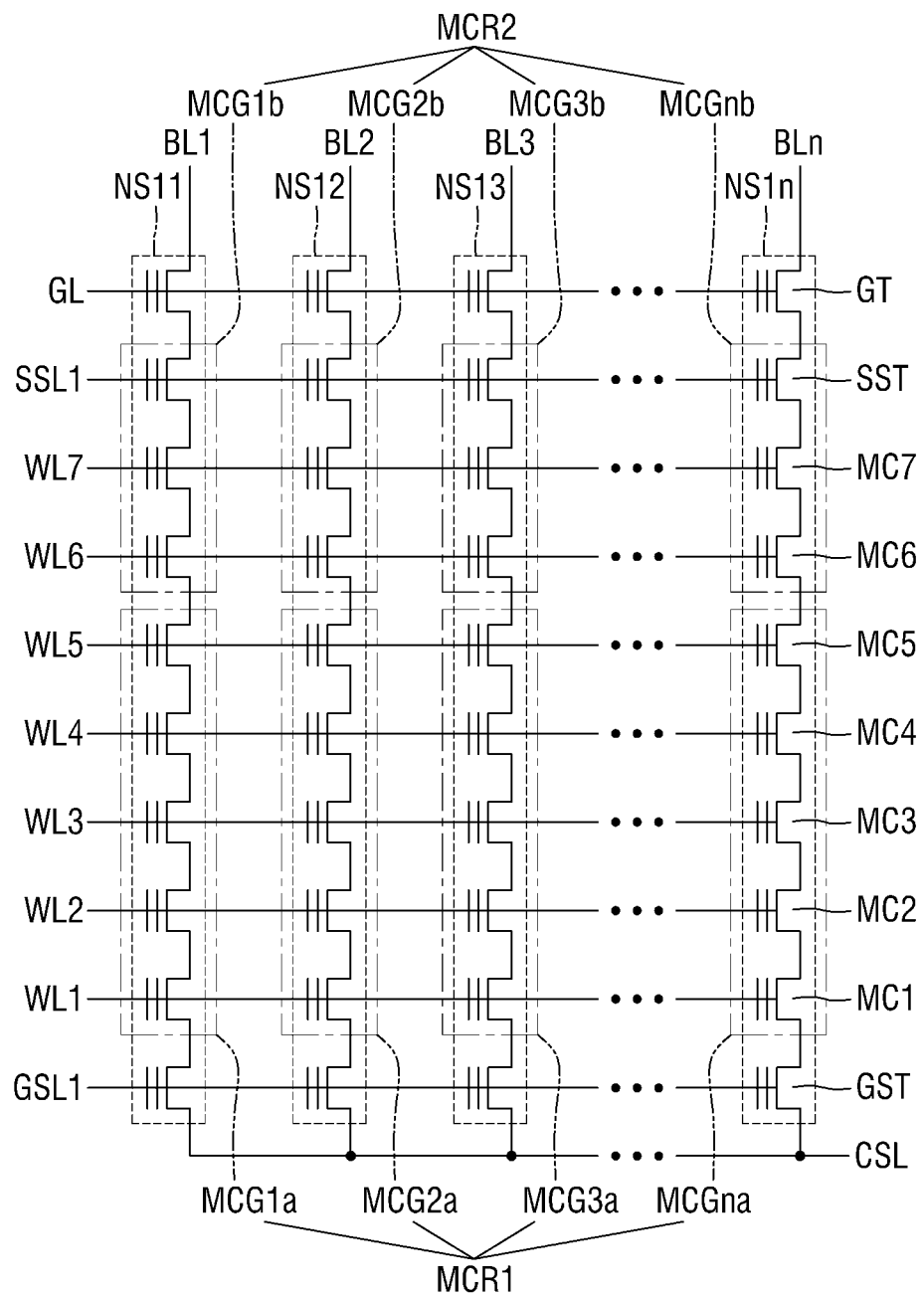
FIG. 5 illustrates a circuit diagram of the cell strings connected to one string selection line in the memory block of FIG. 4.
Figure 6:
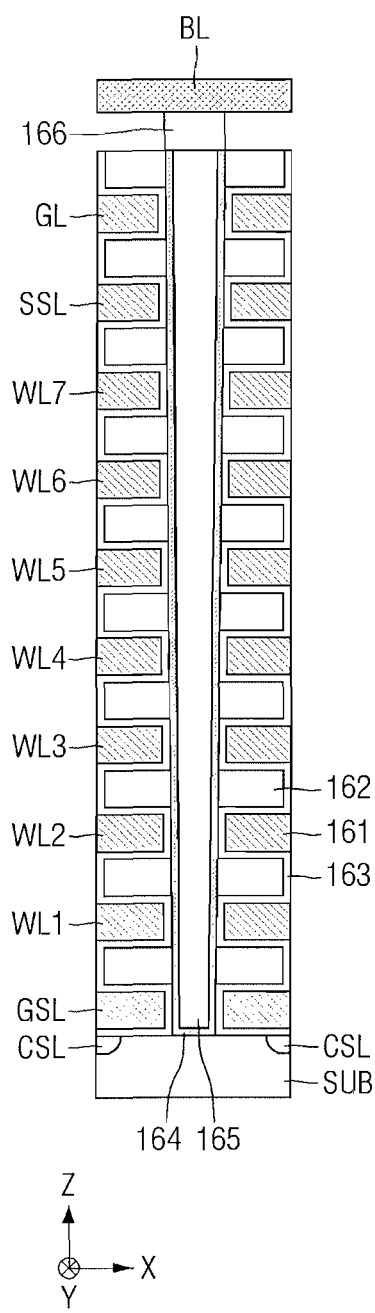
FIG. 6 illustrates one cell string included in the cell string of FIG. 5.

The cell string included in the memory cell array 160 will be described with reference to FIGS. 2 through 7. FIG. 5 is a circuit diagram illustrating the cell strings connected to one string selection line in the memory block of FIG. 4. FIG. 6 illustrates one cell string in the cell string of FIG. 5.

Referring to FIGS. 4 and 5, the memory block may include a plurality of cell strings NS11 to NS1n connected to the first string selection line SSL1. Although FIG. 5 illustrates only the plurality of cell strings NS11 to NS1n connected to the first string selection line SSL1, a plurality of cell strings connected to other string selection lines is also similar.

Referring to FIG. 5, a plurality of cell strings NS11 to NS1n may be connected to a plurality of bit lines BL1 to BLn, respectively. A GIDL transistor GT of each of the plurality of cell strings NS11 to NS1n may be connected to the GIDL line GL. A string selection transistor SST of each of the plurality of cell strings NS11 to NS1n may be connected to the first string selection line SSL1. Each of the plurality of memory cells MC1 to MC7 of each of the plurality of cell strings NS11 to NS1n may be connected to each of the plurality of word lines WL. A ground selection transistor GST of each of the plurality of cell strings NS11 to NS1n may be connected to a first ground selection line GSL.

Each of the plurality of cell strings NS11 to NS1n may include a memory cell group including at least one memory cell. For example, the first cell string NS11 may include a first memory cell group MCG1a including five memory cells MC1 to MC5. Also, the second to n-th cell strings NS12 to NS1n may include first memory cell groups MCG2a to MCGna each including five memory cells MC1 to MC5, respectively. As another example, the first cell string NS11 may include a first memory cell group MCG1a including five memory cells MC1 to MC5 and a second memory cell group MCG1b including two memory cells MC6 and MC7. In addition, the second to n-th cell strings NS12 to NS1n may respectively include first memory cell groups MCG2a to MCGna each including five memory cells MC1 to MC5, and second memory cell groups MCG2b to MCGnb each including two memory cells MC6 and MC7.

In FIG. 5, although the first to n-th cell strings NS11 to NS1n are illustrated as including a memory cell group including five memory cells and a memory cell group including two memory cells, respectively, any number of memory cell groups and any number of memory cells in a memory cell group may be employed.

Referring to FIG. 6, the first cell string NS11 may include a substrate SUB, a common source line CSL, a gate electrode 161, an insulating layer 162, a charge trap layer 163, a core line 164, a core layer 165, and a string drain 166.

The common source line CSL is formed on the substrate SUB and may be connected to the adjacent cell strings.

The gate electrode 161 and the insulating layer 162 may be alternately stacked on the substrate SUB. The stacked gate electrode 161 may be used as the ground selection line GSL, the plurality of word lines WL, the string selection line SSL, and the GIDL line GL. Hereinafter, for the convenience of description, the gate electrode 161 may be called the ground selection line GSL, the plurality of word lines WL, the string selection line SSL, and the GIDL line GL, respectively.

The charge trap layer 163 may be between the gate electrode 161 and the insulating layer 162 and between the gate electrode 161 and the core line 164. Although FIG. 6 illustrates that the charge trap layer 163 includes one film, this is for the convenience of description, and the charge trap layer 163 may include a plurality of layers.

The charge trap layer 163 may store the introduced electrons. For example, electrons present in the core line 164 may flow into the charge trap layer 163 by a tunneling effect or the like. Electrons introduced into the charge trap layer 163 may be fixed to the charge trap layer 163. Electrons introduced into the charge trap layer 163 may not move along the charge trap layer 163. For example, a first portion of the charge trap layer 163 formed between the first word line WL and the core line 164 may include the introduced electrons. At the same time, a second portion of the charge trap layer 163 formed between the second word line WL and the core line 164 may not include electrons.

An amount of electrons stored in the charge trap layer 163 may be expressed as an electron level. For example, the first portion of the charge trap layer 163 may be programmed to have electrons of a first electron level. Also, the second portion of the charge trap layer 163 may be programmed at a second electron level different from the first electron level.

The core line 164 may be connected to the bit line BL through the string drain 166. The core line 164 may be connected to the common source line CSL through the substrate SUB.

The ground selection line GSL may be used as a gate of the ground selection transistor GST. For example, the ground selection line GSL, a part of the charge trap layer 163 between the ground selection line GSL and the core line 164, and a part of the core line 164 at the same level as the ground selection line GSL may form a ground selection transistor GST.

Similarly, each of the plurality of word lines WL may be used as a gate of each of the plurality of memory cells MC1 to MC7. The string selection lines SSL and the GIDL line GL may also be used as a gate of the string selection transistor SST and the GIDL transistor, respectively.

The core line 164 may be between the string drain 166 and the substrate SUB and may surround the core layer 165. That is, the core line 164 may be a trench filled with the core layer 165. The core layer 165 may include an insulating material. For example, the core layer 165 may include silicon oxide.

The core line 164 may be used as a channel through which a current flows between the string drain 166 and the common source line CSL. For example, the core line 164 may be controlled by the voltage applied to the ground selection line GSL, the plurality of word lines WL, the string selection line SSL, and the GIDL line GL between the common source line CSL and the string drain 166.

For example, when an operation of reading the first memory cell MC1 is performed, a bit line read voltage may be applied to the first bit line BL1. A selection voltage may be applied to the GIDL line GL, the string selection line SSL, and the ground selection line GSL. A read pass voltage may be applied to the second to seventh word lines WL. A word line read voltage may be applied to the first word line WL. A source voltage (e.g., 0V) may be applied to the common source line CSL. At this time, all the remaining transistors except the first memory cell MC1 may be activated.

When the first memory cell MC1 is not programmed, the first memory cell MC1 may be activated by the word line read voltage. When the first memory cell MC1 is programmed, the first memory cell MC1 may not be activated by the word line read voltage.

In this way, the core line 164 may be activated only when the first memory cell MC1 is not programmed. Therefore, the first memory cell MC1 may be read via the presence or absence of activation of the core line 164.

Figure 7:
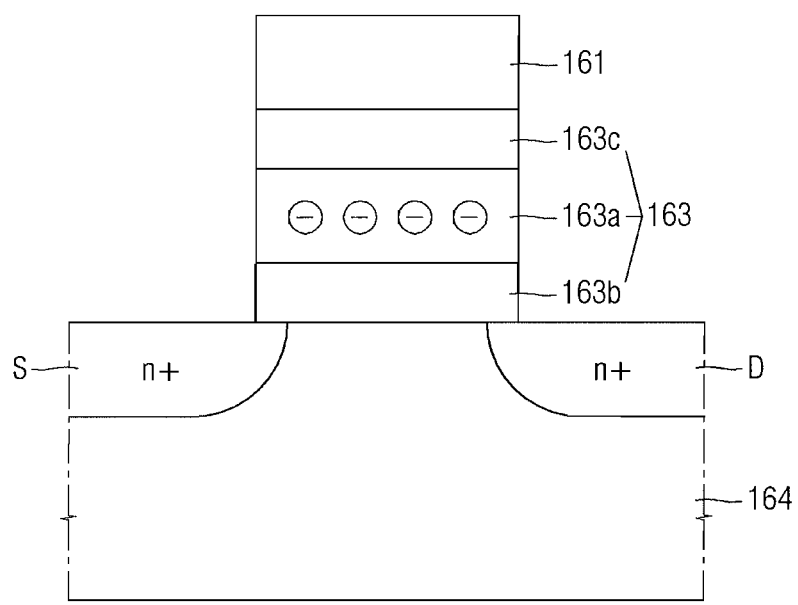
FIG. 7 illustrates a GIDL transistor included in the cell string of FIG. 6.
Figure 8A:
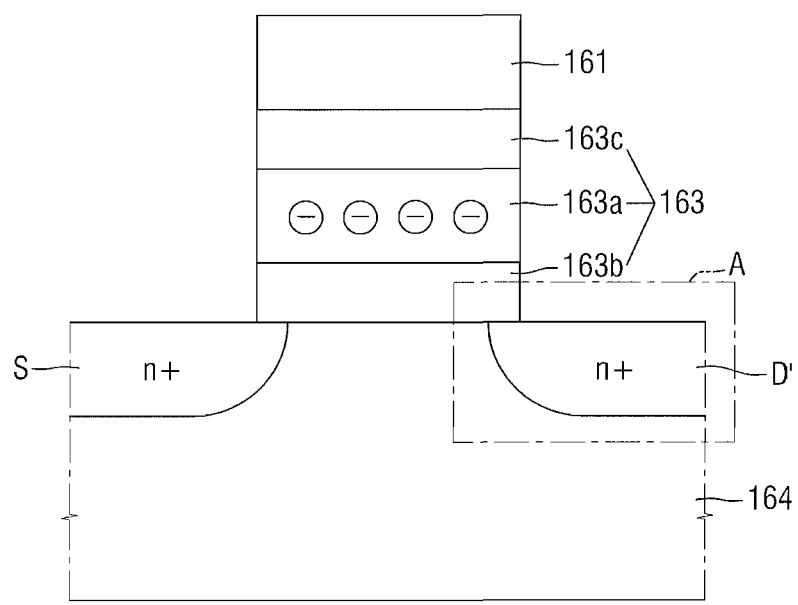
FIG. 8a illustrates the operation of the GIDL transistor of FIG. 7.
Figure 8B:
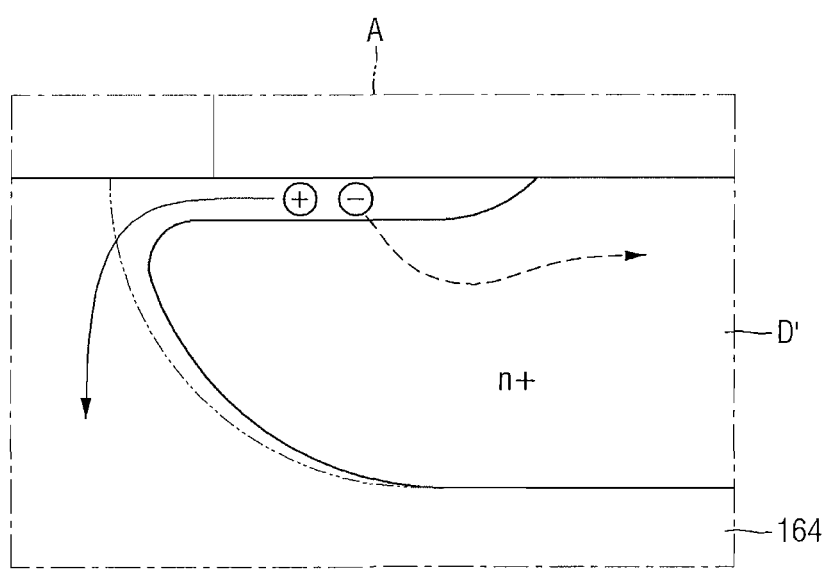

The operation of the GIDL transistor included in the cell string will be described below with reference to FIGS. 5, 6, 7 8a and 8b. FIG. 7 illustrates a GIDL transistor included in the cell string of FIG. 6. FIG. 8a illustrates the operation of the GIDL transistor of FIG. 7. FIG. 8b is an enlarged view of a region A of FIG. 8a.

In FIG. 7, the GIDL transistor GT may be formed as a gate electrode 161, a part of the charge trap layer 163, and a part of the core line 164. The core line 164 may be connected to the string drain 166 and the common source line CSL. The gate electrode 161 of the GIDL transistor GT may be a part of the GIDL line GL of FIG. 6. The charge trap layer 163 may include a first silicon oxide layer 163b, a silicon nitride layer 163a, and a second silicon oxide layer 163c, which are sequentially stacked.

The silicon nitride layer 163a may include the introduced electrons. The first silicon oxide layer 163b may block electrons introduced into the silicon nitride layer 163a from being emitted to the core line 164. The second silicon oxide layer 163c may block the electrons introduced into the silicon nitride layer 163a from being emitted to the gate electrode 161.

In FIG. 7, the GIDL transistor GT is illustrated as including the drain D and the source S formed on the core line 164 for convenience of explanation. In an implementation, the drain D and the source S illustrated in FIG. 7 may be the string drain 166 and the common source line CSL illustrated in FIG. 6. That is, the drain D and the source S may not be formed on the core line 164.

The GIDL transistor GT may be programmed to have a predetermined electronic level. For example, electrons of a predetermined electron level may flow into the charge trap layer 163 of the GIDL transistor, and the charge trap layer 163 of the GIDL transistor may store the flowed electrons.

Referring to FIGS. 8a and 8b, the GIDL transistor GT may generate a gate induced drain leakage current, i.e., the GIDL current. The GIDL current may be generated by a difference between the gate voltage VG applied to the gate electrode 161 and the drain voltage VD applied to the drain. For example, the GIDL current may be generated when the gate voltage VG is smaller than the drain voltage VD.

When the gate voltage VG is smaller than the drain voltage VD, a deficient region forming the drain D may be decrease. For example, the deficient region of a drain D' when the gate voltage VG is smaller than the drain voltage VD may be smaller than the deficient region of the drain D of other cases.

When deficient region of the drain D decreases, a hole-electron pair may be generated. The hole-electron pair may be separated into holes and electrons. The separated electrons may be discharged to the outside (e.g., bit line) of the GIDL transistor GT through the drain D.

The separated holes flow into the core line 164. The amount of holes flowing into the core line 164 may be expressed as a hole level. For example, the core line 164 may include holes of a predetermined hole level. Holes included in the core line 164 may form a core line voltage.

The amount of holes generated by the GIDL transistor GT may be determined by the amount of electrons contained in the charge trap layer 163 of the GIDL transistor GT. For example, if the GIDL transistor GT is programmed at the first electron level, the amount of holes generated by the GIDL transistor GT may be determined by the gate voltage VG, the drain voltage, and the voltage formed by the electrons of the first electron level of the charge trap layer 163. Specifically, when the GIDL transistor GT is programmed at a higher electronic level, the amount of holes generated in the GIDL transistor GT increases. In this way, the magnitude of the core line voltage of the core line 164 may be increased by programming the GIDL transistor GT.

The plurality of memory cells MC1 to MC7 included in the cell string may be affected by the core line voltage generated by the GIDL transistor GT. For example, some of the plurality of memory cells MC1 to MC7 may be erased by a difference between the word line erase voltage applied to at least some of the plurality of word lines WL and the core line voltage of the core line 164. For example, electrons included in the charge trap layer 163 of the first memory cell group MCG1a may be discharged to the core line 164 due to the difference between the word line erase voltage and the core line voltage.

Referring to FIGS. 2 and 5 again, when the control logic 150 receives an erase command, the control logic 150 may execute an erase work on at least one of the plurality of memory blocks of the memory cell array 160. For example, the control logic 150 may perform erase operations, verification operations, GIDL program operations, and GIDL recovery operations on some memory blocks of the memory cell array 160.

The control logic 150 may include a GIDL program controller 154. The GIDL program controller 154 may perform the GIDL program operation and the GIDL recovery operation included in the erase loop. For example, the GIDL program controller 154 may perform erase operations, verification operations, GIDL program operations, and GIDL recovery operations on some memory blocks of the memory cell array 160.

In FIG. 5, the plurality of memory cells MC1 to MC7 may include a first memory cell region MCR1 and a second memory cell region MCR2. For example, the first memory cell region may include first memory cell groups MCG1a to MCGna. The second memory cell region may include second memory cell groups MCG1b to MCGnb.

In some embodiments, the erase work may include a first erase work of a first memory cell region MCR1 among a plurality of memory cells MC1 to MC7, and a second erase work of a second memory cell region MCR2. For example, the erase work may execute the second erase work of the second memory cell region MCR2 after completing the first erase work of the first memory cell region MCR1.

The erase work may include a plurality of erase loops. For example, the erase work may include a first erase loop and a second erase loop. The first erase loop may include an erase operation, a verification operation, and a GIDL program operation. The second erase loop may include an erase operation, a verification operation, and a GIDL recovery operation.

The erase operation may recover the plurality of memory cells MC1 to MC7 included in each of the plurality of cell strings NS11 to NS33 to a state before being programmed. For example, when the erase operation is performed, electrons stored in the charge trap layer 163 may be emitted to the core line 164. At this time, the electron level of the charge trap layer 163 of the memory cell MC may be lowered.

In the erase operation according to some embodiments, the same bit line erase voltage (e.g., 18V) may be applied to each of the plurality of bit lines BL. In some embodiments, the non-volatile memory device may save resources by applying the same voltage to each of the plurality of bit lines BL in the erase operation. This is because additional resources are needed to apply different erase voltages for each bit line in the erase operation.

In the erase operation, a GIDL line voltage (e.g., 10V) smaller than the bit line erase voltage may be applied to the GIDL line GL. If the GIDL line voltage (e.g., 10V) is smaller than the bit line voltage (e.g., 18V) connected to the drain D of the GIDL transistor GT, the GIDL transistor GT may generate holes. Holes generated by the GIDL transistor GT may be applied to the core line 164 to form a core line voltage.

In the erase operation, a word line erase voltage (e.g., 0.6V) smaller than the core line voltage formed by the GIDL transistor GT may be applied to the word line WL connected to the plurality of cell strings NS11 to NS33. Each of the plurality of memory cells MC1 to MC7 included in the plurality of cell strings NS11 to NS33 may be erased by the difference between the word line erase voltage and the core line voltage.

In some embodiments, the erase operation may erase only some of a plurality of memory cells MC1 to MC7. For example, the erase operation may erase the first memory cell region MCR1 and may not erase the second memory cell region MCR2. In this case, an erase voltage (e.g., 0.6V) may be applied to the word line WL connected to the first memory cell region MCR1. Also, an erase pass voltage (e.g., 12V) may be applied to the word line WL connected to the second memory cell region MCR2.

The verification operation may detect the erase results of a plurality of memory cells MC1 to MC7 connected to each of a plurality of cell strings NS11 to NS33.

The erase results may be determined by the electron level contained in the charge trap layer 163 of the memory cell. If the electron level contained in the charge trap layer 163 of the memory cell is smaller than the predetermined verification electron level, it may be considered that the erase is completed.

A threshold voltage of the memory cell may be determined by the electronic level contained in the charge trap layer 163 of the memory cell MC. Therefore, the erase results may be determined that the erase is completed when the threshold voltage of the memory cell is smaller than the predetermined verification voltage.

When the verification operation is performed, the page buffer circuit 140 may receive the erase results of the memory cell MC connected to each of the plurality of cell strings NS11 to NS33 via the bit line BL.

As an example, if the erase of the plurality of memory cells MC1 to MC7 connected to each of the first cell string NS11 is completed, the page buffer circuit 140 may receive an erase success (PASS) signal through the first bit line BL1.

As another example, when the erase of at least one of the plurality of memory cells MC1 to MC7 connected to each of the first cell string NS11 is not completed, the page buffer circuit 140 may receive an erase failure (FAIL) signal through the first bit line BL1.

In the verification operation, a verification voltage (e.g., 0.5V) may be applied to a plurality of word lines WL connected to a plurality of memory cells MC1 to MC7 of a plurality of cell strings NS11 to NS33.

In some embodiments, the verification operation may verify only the erased memory cells among the plurality of memory cells MC1 to MC7. For example, the verification operation may verify the erased first memory cell region MCR1 and may not verify the non-erased second memory cell region MCR2. In this case, a verification voltage (e.g., 0.5V) may be applied to the word line WL connected to the first memory cell region MCR1. Also, a verification pass voltage (e.g., 6V) may be applied to the word line WL connected to the second memory cell region MCR2.

The GIDL program operation may program the GIDL transistors included in some of the plurality of cell strings NS11 to NS33. For example, the program voltage may be applied to the first bit line BL1 to program the GIDL transistor of the first cell string NS11, and the inhibit voltage may be applied to the remaining bit lines BL not to program the GIDL transistor GT of the remaining cell strings.

When the GIDL program operation is performed, the charge trap layer 163 of the GIDL transistor GT included in some of the plurality of cell strings NS11 to NS33 may have an increased electron level. As the first erase loop is repeated, by programming the GIDL transistor GT of the cell string including the non-erased memory cell MC, a higher erase voltage may be applied to the cell string.

The degree of program of the GIDL transistor GT may be represented by a level. For example, the level of the GIDL transistor GT in which the GIDL transistor GT is programmed may increase. Also, when the GIDL transistor GT is programmed at a high level, the electron level contained in the charge trap layer of the GIDL transistor GT is high.

As the first erase loop is repeated, each of the GIDL transistors GT of some cell strings of the plurality of cell strings may be programmed at different levels. For example, the GIDL transistor GT of the first cell string NS11 may be programmed at the first level. The GIDL transistor GT of the second cell string NS12 may be programmed at the second level smaller than the first level. At this time, the first level and the second level may be determined depending on the number of times at which each GIDL transistor is programmed.

The GIDL program operation may program a GIDL transistor GT included in some of the plurality of cell strings NS11 to NS33 depending on the erase result of the verification operation. For example, the GIDL program operation may program the GIDL transistor GT included in the first cell string NS11 determined that the erase is not completed. At the same time, the GIDL program operation may not program the GIDL transistor GT included in the second cell string NS12 determined that the erase is completed.

The GIDL program operation according to some embodiments may program the GIDL transistor GT of the first cell string NS11 and may not program the GIDL transistor GT of the second cell string NS12. In this case, a program voltage (e.g., 0V) may be applied to the first bit line BL1 connected to the first cell string NS11. In addition, an inhibit voltage (e.g., 2V) different from the program voltage may be applied to the second bit line BL connected to the second cell string NS12. In an implementation, the program voltage may be smaller than the inhibit voltage. Also, in this case, in the GIDL program operation, the GIDL program voltage (e.g., 18V) may be applied to the GIDL line connected to the plurality of cell strings NS11 to NS33.

The GIDL recovery operation may recover all GIDL transistors included in the plurality of cell strings NS11 to NS33. For example, the GIDL program controller 154 may apply a GIDL erase voltage to each of a plurality of bit lines BL to recover all the GIDL transistors GT included in the plurality of cell strings NS11 to NS33 to a state before being programmed.

When the GIDL recovery operation is performed, electrons stored in the charge trap layer 163 of all GIDL transistors GT included in the plurality of cell strings NS11 to NS33 may be discharged to the core line 164.

In some embodiments, the GIDL recovery operation may set the charge trap layer 163 of all the GIDL transistors GT at an initial electronic level. That is, the GIDL recovery operation may recover the electron level of the GIDL transistor GT increased by the first erase loop to an initial value.

The verification operation may determine which erase loop among the first erase loop or the second erase loop is executed. For example, if the erase of all the memory cells to be verified is completed, the erase result may be a success (PASS). If the erase of at least one of the memory cells to be verified is not completed, the erase result may be a failure (FAIL).

If the erase result is the failure (FAIL), the GIDL program operation may be performed after the verification operation. At this time, the GIDL program operation may program GIDL transistors included in a cell string in which the erase is not completed If the erase result is the success (PASS), a GIDL recovery operation may be performed after the verification operation. At this time, the GIDL transistors included in all cell strings may be recovered to the state before being programed.

The erase work may include a plurality of first erase loops and a single second erase loop. For example, the first erase loop may be performed repeatedly before the erase result is a success (PASS). If the erase result is a success (PASS), a second erase loop may be performed once to complete the erase work.

The erase work performed by the control logic 150 and the GIDL program controller 154 will be specifically described below with reference to FIGS. 2, 5, 9a and 9b. FIGS. 9a and 9b are diagrams illustrating threshold voltage illustrating the erase work of the memory device of FIG. 2. For reference, FIGS. 9a and 9b are views illustrating the GIDL transistors GT of the first and second cell strings NS11 and NS12 of FIG. 5 and a threshold voltage V_th of one memory cell MC of a plurality of memory cells.

The threshold voltages of the GIDL transistors GT and the memory cells MC of the first and second cell strings NS11 and NS12 may be determined by the electronic level included in the charge trap layers of each transistor in FIGS. 9a and 9b. For example, if the GIDL transistor GT has a high electron level, the gate voltage for activating the GIDL transistor GT may be increased by the voltage generated by the electrons of the charge trap layer of the GIDL transistor GT. The same also applies to the case of the memory cell MC.

Referring to FIG. 9a, a first erase loop LOOP1 may include an erase operation, a verification operation, and a GIDL program operation.

In the erase operation, the GIDL transistors GT of each of the first and second cell strings NS11 and NS12 may have threshold voltages of V_GT1 and V_GT2, respectively. At this time, the threshold voltage of V_GT1 and V_GT2 may mean a non-programmed threshold voltage.

In the erase operation, the memory cells MC of each of the first and second cell strings NS11 and NS12 may be erased. For example, the threshold voltage of the memory cell MC of the first cell string NS11 may be V_MC1 which is greater than the verification voltage. Also, the threshold voltage of the memory cell MC of the second cell string NS12 may be V_MC2 which is smaller than the verification voltage.

In the verification operation, the threshold voltage of the GIDL transistors GT of each of the first and second cell strings NS11 and NS12 may not change. In the verification operation, the erase results of the memory cells MC of each of the first and second cell strings NS11 and NS12 may be detected.

For example, the threshold voltage V_MC1 of the memory cell MC of the first cell string NS11 may be greater than a verification voltage Vverify. That is, the memory cell MC of the first cell string NS11 may be determined that the erase is not completed.

Also, the threshold voltage V_MC2 of the memory cell MC of the second cell string NS12 may be smaller than the verification voltage V_verify. That is, the memory cell MC of the second cell string NS12 may be determined that the erase is completed.

The verification operation may determine that the erase of at least one memory cell MC among the memory cells MC of each of the first and second cell strings is not completed. Therefore, the erase result of the verification operation may be determined as a failure (FAIL).

In the GIDL program operation, the GIDL transistor of the first cell string NS11 may be programmed. For example, the threshold voltage of the GIDL transistor of the first cell string NS11 may be changed from V_GT1 to V_GT1'.

In the GIDL program operation, the GIDL transistor of the second cell string NS12 may not be programmed. For example, the threshold voltage of the GIDL transistor of the second cell string NS12 may be maintained at V_GT2.

Referring to FIG. 9b, the second erase loop LOOP2 may include an erase operation, a verification operation, and a GIDL recovery operation.

In the erase operation, the GIDL transistors GT of each of the first and second cell strings NS11 and NS12 may have threshold voltages of V_GT1' and V_GT2, respectively. In the erase operation, the memory cells MC of each of the first and second cell strings NS11 and NS12 may be erased.

For example, the memory cell MC of the first cell string NS11 may be erased with a voltage higher than the erase voltage in the first erase loop LOOP1. Therefore, the threshold voltage of the memory cell MC of the first cell string NS11 may be changed to V_MC1' smaller than the verification voltage.

The memory cells MC of the second cell string NS12 may be erased at the same voltage as the erase voltage in the first erase loop LOOP1. Therefore, the threshold voltage of the memory cell MC of the second cell string NS12 may be maintained at V_MC2.

Also, for convenience of explanation, FIG. 9b illustrates a case where the threshold voltage of the memory cell MC of the second cell string NS12 is not changed by the erase operation. In an implementation, when the erase operation of the second erase loop is performed, the threshold voltage of the memory cell MC of the second cell string NS12 may further decrease.

In the verification operation, the threshold voltages of the GIDL transistors GT of each of the first and second cell strings NS11 and NS12 may not change. In the verification operation, the erase results of the memory cells MC of each of the first and second cell strings NS11 and NS12 may be detected.

For example, the threshold voltage V_MC1' of the memory cell MC of the first cell string NS11 may be smaller than the verification voltage Vverify. That is, the memory cell MC of the first cell string NS11 may be determined that the erase is completed.

Also, the threshold voltage V_MC2 of the memory cell MC of the second cell string NS12 may be smaller than the verification voltage V_verify. That is, the memory cell MC of the second cell string NS12 may be determined that the erase is completed.

All the memory cells MC of each of the first and second cell strings NS11 and NS12 may be determined by the verification operation that the erase is completed. Therefore, the erase result of the verification operation may be determined as a success (PASS).

In the GIDL recovery operation, the GIDL transistor GT of the first and second cell strings NS11 and NS12 may be recovered to the state before being programmed. For example, the threshold voltage of the GIDL transistor of the first cell string NS11 may be changed from V_GT1' back to V_GT1.

Figure 10:
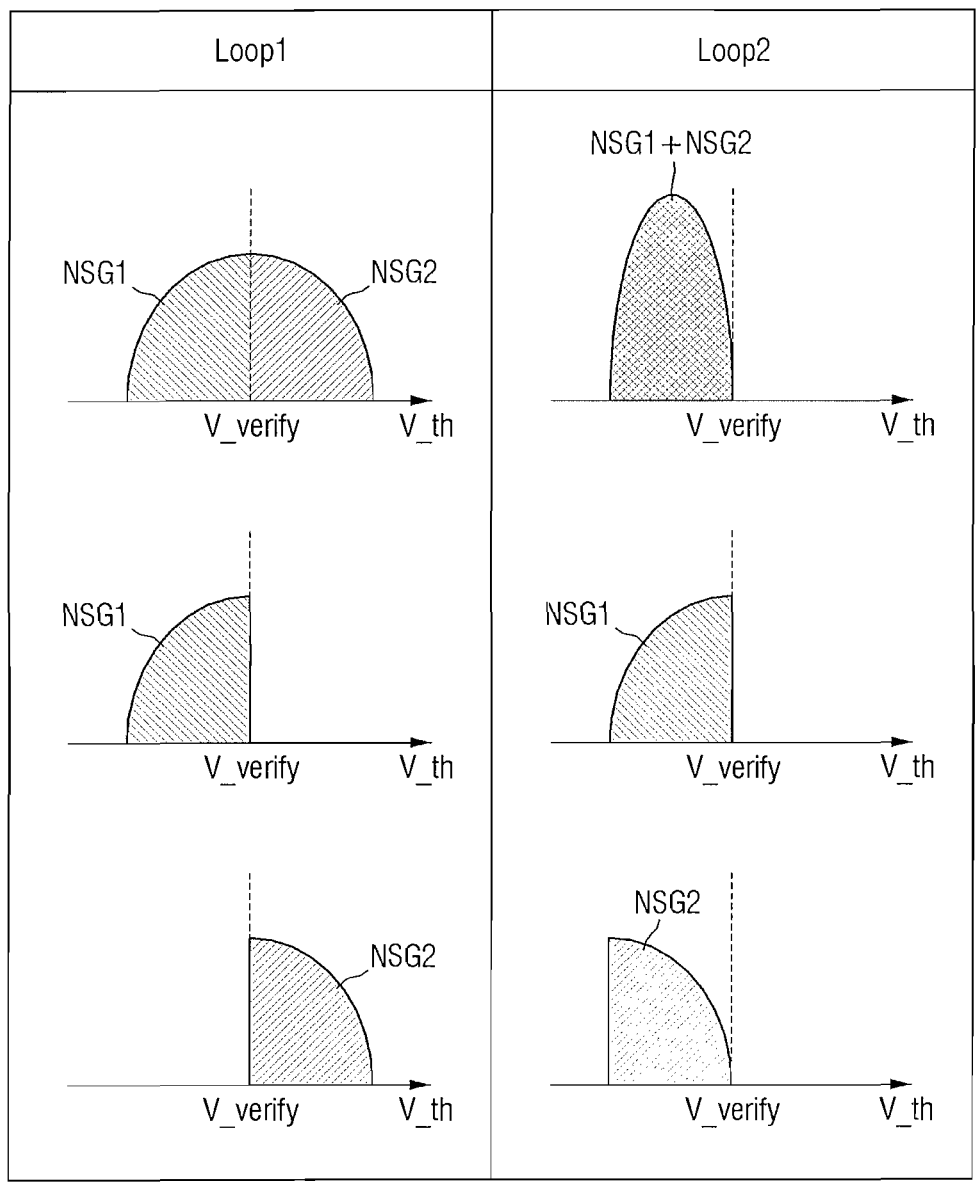
FIG. 10 is a diagram for illustrating the advantageous effect of the erase work performed by the memory device of FIG. 2.

Hereinafter, effects of the non-volatile memory system according to some embodiments will be described with reference to FIGS. 2, 9a, 9b, and 10. FIG. 10 illustrates the effect of the erase work performed by the memory device of FIG. 2. For reference, FIG. 10 illustrates threshold voltage distributions of a plurality of memory cells checked by the verification operations of the first erase loop LOOP1 and the second erase loop LOOP2.

Referring to FIG. 10, in the verification operation of the first erase loop LOOP1, memory cells of a plurality of cell strings included in a specific memory block of the memory cell array 160 may have threshold voltages of the first distribution. For example, the plurality of cell strings may include a first cell string group NSG1 and a second cell string group NSG2.

The threshold voltage of the memory cell of the first cell string group NSG1 may be smaller than the verification voltage V_verify. The first cell string group NSG1 may be determined that the erase is completed.

The threshold voltage of the memory cell of the second cell string group NSG2 may be larger than the verification voltage V_verify. That is, the second cell string group NSG2 may be determined that the erase is not completed.

In the verification operation of the second erase loop LOOP2, the memory cells of the plurality of cell strings included in the memory block may have threshold voltages of the second distribution.

For example, in the GIDL program operation of the first erase loop LOOP1, the GIDL transistor GT of the second cell string group NSG2 is programmed, and the threshold voltage of the second cell string group NSG2 may be changed to the verification voltage or less.

In this way, as only the threshold voltage of the second cell string group NSG2 decreases, the second distribution may have a range narrower than the first distribution.

As a result, by programming the GIDL transistors for each cell string, the erase operations of the entire memory cell may be finely performed. The erase operations may suppress or reduce the occurrence of deeply erased memory cells, which may result in excess holes. Thus, the reliability of the non-volatile memory device can be increased.

Figure 11:
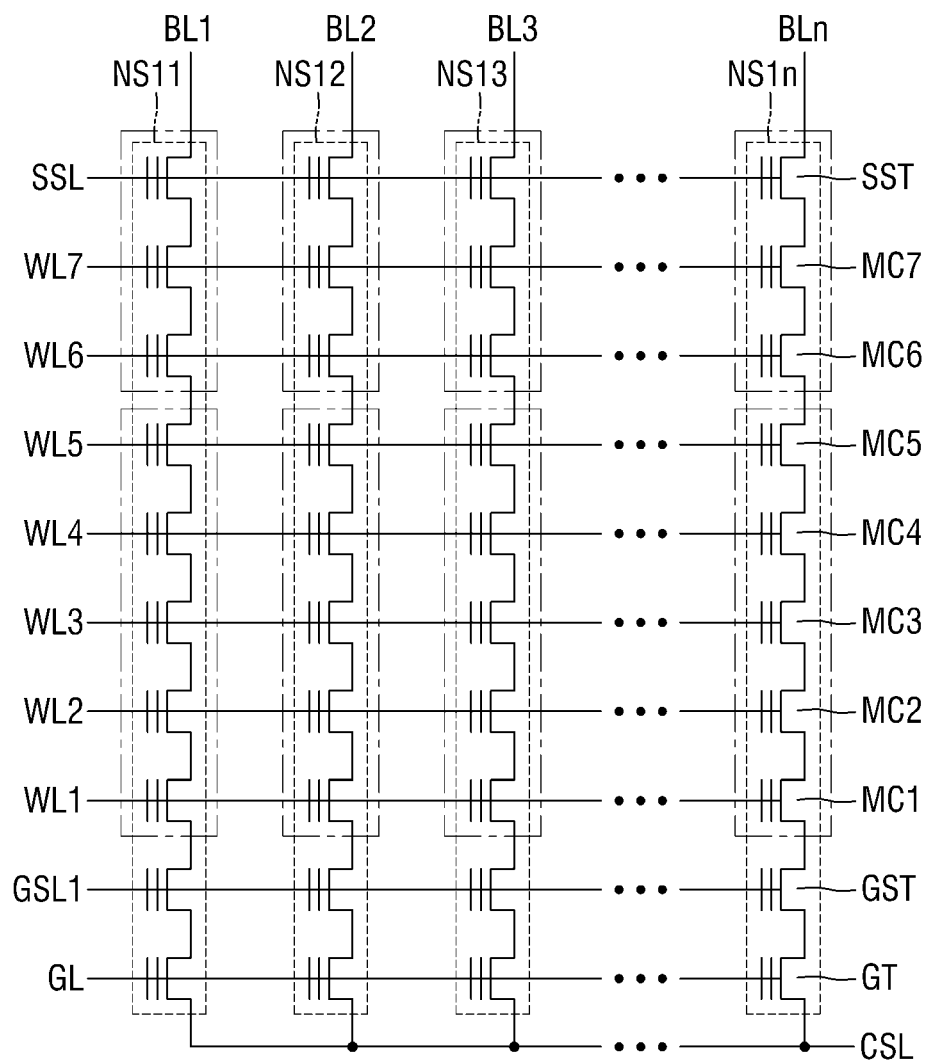
FIG. 11 illustrates one side of the memory block in the memory cell array of the memory device according to some embodiments.

The memory device according to some embodiments will be described below with reference to FIGS. 2 and 11. FIG. 11 illustrates one side of the memory block in the memory cell array of the memory device according to some embodiments.

Referring to FIG. 11, the GIDL transistor GT may be under the ground selection transistor GST. In this case, the bit line BL may be connected to the string selection transistors SST of the plurality of cell strings NS11 to NS33.

The GIDL transistor GT may be directly connected to the common source line CSL. The GIDL transistor GT may generate holes on the basis of the difference between the source voltage applied to the common source line CSL and the gate voltage applied to the GIDL line. The generated holes may flow into the core line 164 to form a core line voltage. For example, in the erase operation, the source voltage (e.g., 18V) applied to the common source line CSL may be greater than the voltage (e.g., 10V) applied to the GIDL line.

Figure 12:
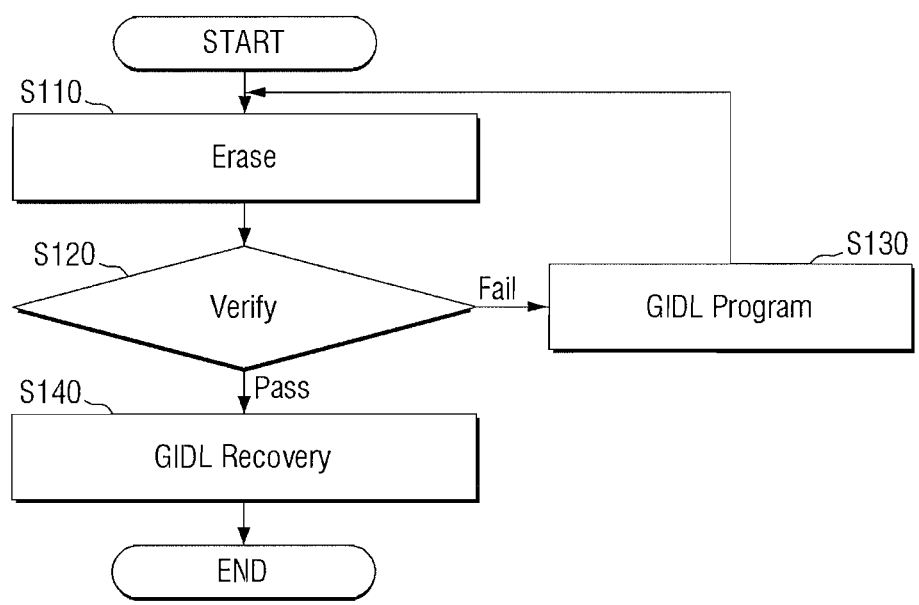
FIG. 12 illustrates a flowchart for explaining the erase method of the memory device according to some embodiments.

Hereinafter, an erase method of the memory device according to some embodiments will be described with reference to FIGS. 2, 5 and 12. FIG. 12 is a flowchart for explaining the erase method of the memory device according to some embodiments.

Referring to FIG. 12, the erase method includes an erase operation (S110), a verification operation (S120), a GIDL transistor program operation (S130), and a GIDL transistor recovery operation (S140).

A plurality of memory cells MC1 to MC7 included in the plurality of cell strings NS11 to NS33 may be erased in the erase operation (S110). In the verification operation (S120), erase results of a plurality of memory cells MC1 to MC7 included in a plurality of cell strings NS11 to NS33 may be verified.

If the erase result is determined as a failure (FAIL) in the verification operation (S120), a GIDL transistor program operation (S130) may be performed. In the GIDL transistor program operation (S130), some GIDL transistors GT of a plurality of cell strings NS11 to NS33 may be programmed.

If the erase result is determined as a success (PASS) in the verification operation (S120), a GIDL transistor recovery operation (S140) may be performed. In the GIDL transistor recovery operation (S140), the GIDL transistors GT of the plurality of cell strings NS11 to NS33 may be recovered to a state before being programmed.

Figure 13:
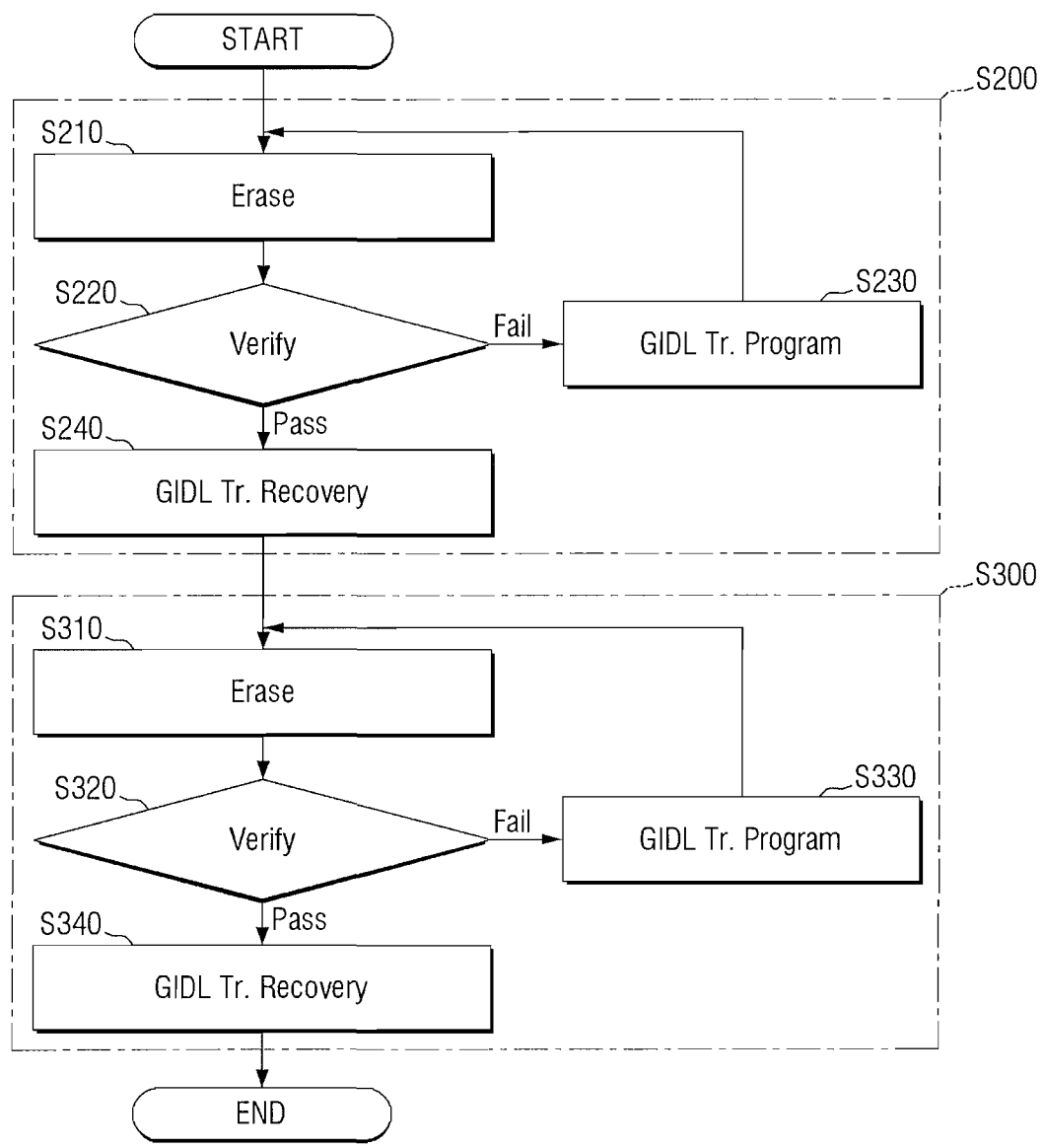
FIG. 13 illustrates a flowchart for explaining the erase method of the memory device according to some embodiments.

The erase method of the memory device according to some embodiments will be described with reference to FIGS. 2, 5, 12 and 13 of the present application. FIG. 13 is a flowchart for explaining the erase method of the memory device according to some embodiments.

Referring to FIG. 13, the erase method includes a first region erase operation (S200) and the second region erase operation (S300).

The first region erase operation (S200) includes an erase operation (S210) of erasing memory cells of the first memory cell region MCR1, and a verification operation (S220) of erasing the memory cells of the first memory cell region MCR1.

Also, the first region erase operation (S200) includes a GIDL transistor program operation (S230) of programming the GIDL transistors included in some of the plurality of cell strings NS11 to NS33 and a GIDL transistor recovery operation (S240), which are executed on the basis of the erase result of the verification operation (S220).

The second region erase operation (S300) includes an erase operation (S310) of erasing the memory cells of the second memory cell region MCR2, and a verification operation (S320) of erasing the memory cells of the second memory cell region MCR2.

Also, the second region erase operation S300 includes a GIDL transistor program operation (S330) of programming the GIDL transistors included in some of the plurality of cell strings NS11 to NS33 and a GIDL transistor recovery operation (S340), which are executed on the basis of the erase result of the verification operation (S320).

By way of summation and review, one or more embodiments may provide a highly reliable non-volatile memory device by reducing or suppressing an occurrence of deep erase cell. One or more embodiments may provide an erase method of the highly reliable non-volatile memory device by reducing or suppressing the occurrence of deep erase cell.

Embodiments are described, and illustrated in the drawings, in terms of functional blocks, units, modules, and/or methods. Those skilled in the art will appreciate that these blocks, units, modules, and/or methods are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, modules, and/or methods being implemented by microprocessors or similar, they may be programmed using software (e.g., microcode) to perform various functions discussed herein and may optionally be driven by firmware and/or software. Alternatively, each block, unit, module, and/or method may be implemented by dedicated hardware, or as a combination of dedicated hardware to perform some functions and a processor (e.g., one or more programmed microprocessors and associated circuitry) to perform other functions. Also, each block, unit, and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A non-volatile memory device, comprising:
a memory cell array including a plurality of cell strings which include a first cell string and a second cell string, each of the plurality of cell strings including a gate-induced drain leakage (GIDL) transistor and a memory cell group; and
a control logic to apply a voltage to each of the plurality of cell strings, wherein the control logic performs:
a first erase operation of erasing the memory cell groups of each of the plurality of cell strings using a same first erase voltage, in which the GIDL transistor of the first cell string and the GIDL transistor of the second cell string are both programmed to a same first level,
a first verification operation of detecting erase results of the memory cell groups of each of the plurality of cell strings, a program operation of programming the GIDL transistor of the first cell string to a second level that is higher than the first level, and a second erase operation of erasing the memory cell groups of each of the plurality of cell strings using the programmed GIDL transistor of the first cell string and the programmed GIDL transistor of the second cell string.

2. The non-volatile memory device as claimed in claim 1, wherein the control logic performs:
a second verification operation of verifying the erase results of the memory cell groups of each of the plurality of cell strings, and
a recovery operation of recovering the GIDL transistors of each of the plurality of cell strings in accordance with the second verification operation.

3. The non-volatile memory device as claimed in claim 2, wherein, if the erase result of the second verification operation indicates that all the memory cell groups of the plurality of cell strings are completely erased, the control logic performs the recovery operation.

4. The non-volatile memory device as claimed in claim 1, wherein:
the memory cell array includes a first bit line connected to the first cell string and a second bit line connected to the second cell string, and
the first erase operation includes application of the same first erase voltage to each of the first and second bit lines.

5. The non-volatile memory device as claimed in claim 4, wherein the program operation includes:
application of a program voltage to the first bit line, and
application of an inhibit voltage different from the program voltage to the second bit line.

6. The non-volatile memory device as claimed in claim 1, wherein the first verification operation includes identification of the first cell string including a memory cell group in which erasing is not completed and the second cell string including a memory cell group in which the erase is completed, on the basis of the erase results.

7. The non-volatile memory device as claimed in claim 6, while the program operation, the GIDL transistor of the second cell string is maintained at the first level.

8. A non-volatile memory device, comprising:
a first cell string connected to a first bit line, the first cell string including a first memory cell group, a first gate-induced drain leakage (GIDL) transistor, and a first core line connected to the first memory cell group and the first GIDL transistor;
a second cell string connected to a second bit line, the second cell string including a second memory cell group, a second GIDL transistor, and a second core line connected to the second memory cell group and the second GIDL transistor; and
a control logic configured to apply a voltage to the first bit line, wherein:
the control logic performs a program operation of programming the first GIDL transistor,
the control logic performs an erase operation of erasing the first memory cell group, using the programmed first GIDL transistor, and
when the control logic performs the erase operation, the first GIDL transistor generates holes of a first hole level and provides the holes to the first core line, and the second GIDL transistor generates holes of a second hole level smaller than the first hole level and provides the holes to the second core line.

9. The non-volatile memory device as claimed in claim 8, wherein:
the control logic applies a voltage to the second bit line,
the program operation includes application of a program voltage to a first bit line to program the first GIDL transistor, and application of an inhibit voltage higher than the program voltage to the second bit line not to program the second GIDL transistor, and
the erase operation includes erasing of the second memory cell group, using the second GIDL transistor.

10. The non-volatile memory device as claimed in claim 9, wherein:
the first GIDL transistor includes a first charge trap layer which stores electrons introduced therein,
the second GIDL transistor includes a second charge trap layer which stores electrons introduced therein, and
the program operation includes increasing of an electron level of the first charge trap layer and non-increasing of an electron level included in the second charge trap layer.

11. The non-volatile memory device as claimed in claim 10, further comprising:
GIDL lines connected to gates of the first and second GIDL transistors,
wherein the program operation includes application of a GIDL voltage greater than program voltage and inhibit voltage to the GIDL line.

12. The non-volatile memory device as claimed in claim 10, wherein:
the first hole level is determined on the basis of the electron level of the first charge trap layer, and
the second hole level is determined on the basis of the electron level of the second charge trap layer.

13. The non-volatile memory device as claimed in claim 8, further comprising:
a GIDL line connected to the first GIDL transistor,
wherein the erase operation includes application of a GIDL voltage, which is smaller than the voltage applied to the first bit line, to the GIDL line.

14. A non-volatile memory device, comprising:
a first cell string connected to a first bit line and including a first memory cell group and a first gate-induced drain leakage (GIDL) transistor;
a second cell string connected to a second bit line and including a second memory cell group and a second GIDL transistor; and
a control logic to apply a voltage to the first and second bit lines, wherein the control logic:
programs the first and second GIDL transistors at a first level,
programs the first GIDL transistor at a second level greater than the first level, and
erases the first and second memory cell groups, using the first and second GIDL transistors.

15. The non-volatile memory device as claimed in claim 14, wherein:
the first cell string includes a third memory cell group different from the first memory cell group,
the second cell string includes a fourth memory cell group different from the second memory cell group, and
the control logic does not erase each memory cell of the third and fourth memory cell groups while erasing the first and second memory cell groups.

16. The non-volatile memory device as claimed in claim 15, further comprising:

a first word line group including a plurality of word lines connected to each memory cell of the first memory cell group and the second memory cell group; and a second word line group including a plurality of word lines connected to each memory cell of the third memory cell group and the fourth memory cell group, wherein the control logic applies a first word line voltage to each word line of the first word line group to erase each memory cell of the first and second memory cell groups, and the control logic applies a second word line voltage greater than the first word line voltage to each word line of the second word line group not to erase each memory cell of the third and fourth memory cell groups.

17. The non-volatile memory device as claimed in claim 14, wherein:

the first memory cell group is between the first GIDL transistor and the first bit line, and the second memory cell group is between the second GIDL transistor and the second bit line.

18. The non-volatile memory device as claimed in claim 17, further comprising:

a ground source line connected to the first cell string and the second cell string, the first GIDL transistor and the second GIDL transistor being directly connected to the ground source line.

* * * * *